United States Patent
Takahashi et al.

(10) Patent No.: US 9,651,714 B2
(45) Date of Patent: May 16, 2017

(54) ANTIREFLECTION MULTILAYER FILM

(71) Applicant: FUJIFILM Corporation, Tokyo (JP)

(72) Inventors: Hiroki Takahashi, Saitama (JP); Mototaka Kanaya, Sano (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/689,752

(22) Filed: Apr. 17, 2015

(65) Prior Publication Data

US 2015/0226881 A1 Aug. 13, 2015

Related U.S. Application Data

(63) Continuation of application No. PCT/JP2013/078830, filed on Oct. 24, 2013.

(30) Foreign Application Priority Data

Oct. 25, 2012 (JP) .................. 2012-235702

(51) Int. Cl.
*G02B 1/115* (2015.01)
*G02B 1/18* (2015.01)
*C23C 14/22* (2006.01)

(52) U.S. Cl.
CPC ............ *G02B 1/115* (2013.01); *C23C 14/226* (2013.01); *G02B 1/18* (2015.01)

(58) Field of Classification Search
CPC ........... G02B 1/115; G02B 1/11; G02B 1/113; G02B 1/118; G02B 1/14; G02B 1/18; G02B 5/3008; G02B 5/3083; G02B 5/32; C23C 14/226; G02F 1/13363; G02F 1/133634; G02F 1/133502; G02F 2001/133638; B32B 7/02; B32B 9/00

USPC ......... 359/580, 584, 586, 589, 489.1, 489.2, 359/489.03, 489.07; 349/117–119, 137
See application file for complete search history.

(56) References Cited

FOREIGN PATENT DOCUMENTS

| JP | 63-075701 A | 4/1988 |
|---|---|---|
| JP | 07-027902 A | 1/1995 |
| JP | 09-258004 A | 10/1997 |
| JP | 09258004 A * | 10/1997 |
| JP | 10-068801 A | 3/1998 |
| JP | 10068801 A * | 3/1998 |

(Continued)

OTHER PUBLICATIONS

Communication dated Nov. 30, 2015, issued by the State Intellectual Property Office of the P.R.C. in corresponding Chinese Application No. 20138005589.X. 11 pages in Chinese and English.

(Continued)

*Primary Examiner* — Scott J Sugarman
*Assistant Examiner* — Ibrahima Diedhiou
(74) *Attorney, Agent, or Firm* — Sughrue Mion, PLLC

(57) ABSTRACT

An antireflection multilayer film is formed by alternately laminating high refractive index layers and low refractive index layers having indexes of refraction different from each other. The high refractive index layer is an oblique deposition layer formed by depositing an inorganic material such as tantalum pentoxide onto the surface of an optical element from a diagonal direction, and has minute internal structures composed of slant columnar structures growing along to the deposition direction. The low refractive index layer is an isotropic and dense layer.

11 Claims, 4 Drawing Sheets

(56) References Cited

FOREIGN PATENT DOCUMENTS

| | | |
|---|---|---|
| JP | 2001-228330 A | 8/2001 |
| JP | 2002-156507 A | 5/2002 |
| JP | 2006-119525 A | 5/2006 |

OTHER PUBLICATIONS

International Search Report of PCT/JP2013/078830 dated Dec. 3, 2013 [PCT/ISA/210], 3 pages in Japanese and English.

* cited by examiner

ANTIREFLECTION MULTILAYER FILM

CROSS-REFERENCE TO RELATED APPLICATIONS

This application is a Continuation of PCT International Application No. PCT/JP2013/078830 filed on Oct. 24, 2013, which claims priority under 35 U. S. C. §119 to Japanese Patent Application No. 2012-235702, filed on Oct. 25, 2012. Each of the above application(s) is hereby expressly incorporated by reference, in its entirety, into the present application.

BACKGROUND OF THE INVENTION

1. Field of the Invention

The present invention relates to an antireflection multilayer film formed on a surface of an optical element.

2. Description Related to the Prior Art

In optical instruments, e.g., a digital camera, an image scanner, a liquid crystal display and a projector, optical elements such as lenses and various optical filters are used. Although a shape and an optical effect of the optical element varies depending on uses, in either case, it is common that a single-layer or multilayer antireflection film is applied on the surface of the optical element. This is to prevent deterioration of light utilization efficiency caused by surface reflection on the optical element.

As the antireflection multilayer film, for example, films formed by laminating plural dielectric materials whose indexes of refraction vary (so-called dielectric multilayer film) are known by Japanese Patent Laid-Open Publication No. 2002-156507 and Japanese Patent Laid-Open Publication No. 2006-119525. For the antireflection multilayer film using the dielectric multilayer film, a combination of dielectric materials and these indexes of refraction, a number of layers and a laminating order of each dielectric layers and so on vary depending on a wavelength range to be used and so on. For example, in case two kinds of dielectric materials are used, a dielectric layer including a high refractive index material and a dielectric layer including a low index of refractive material are alternately laminated.

In addition, Japanese Patent Laid-Open Publication No. 07-027902 and Japanese Patent Laid-Open Publication No. 63-075701 suggest to form one oblique deposition layer by depositing an inorganic material from a diagonal direction, as a single-layer antireflection film.

In many optical instruments, dust and dirt is easy to adhere to an optical element which is exposed. When dust and dirt adheres, as a matter of course, optical performance turns worse. In addition, the optical element itself may attract neighboring dust and dirt by electrostatic charge. Furthermore, even in case that the optical element is almost sealed up during use, the optical element will be exposed to outside air for maintenance, and dust and dirt may adhere to it.

In case dust and dirt has adhered on a surface of the optical element, dust and dirt should be removed by an air duster or the like to prevent deterioration of optical performance. However, it is not easy to completely remove dust and dirt which has adhered once. For example, minute dust and dirt often remains even after blowing air using an air duster. Therefore, it is desirable to provide a dust-resistance coating on the surface of the optical element, in addition to the above-mentioned antireflection film.

However, applying the dust-resistance coating additionally on the antireflection film will increase manufacturing cost due to an increase of manufacturing steps. In addition, the antireflection effect of the antireflection film may decrease by applying the dust-resistance coating. Furthermore, the thickness of the optical element increases by the dust-resistance coating. Accordingly, in case the dust-resistance coating is provided for all the optical elements to be used for the optical instrument, since the thickness as a whole becomes a degree that cannot be ignored, downsizing or thinning of the optical instrument may be disturbed.

SUMMARY OF THE INVENTION

An object of the present invention is to provide an antireflection multilayer film having dust resistance property.

In order to achieve the above and other objects, an antireflection multilayer film of the present invention comprises at least a first dielectric layer composed of a first dielectric having high refractive index formed as an oblique deposition layer, a second dielectric layer which is laminated on the first dielectric layer as an isotropic layer and is composed of a second dielectric having lower refractive index than that of the first dielectric, and a third dielectric layer which is laminated on the second dielectric layer as an oblique deposition layer and is composed of the first dielectric.

It is preferable that the first dielectric layer and the third dielectric layer formed as the oblique deposition layers have optical axes which are different from each other in the oblique deposition layers to cancel birefringence occurring in each oblique deposition layer.

It is preferable that birefringence measured in the vertical direction is no more than 1 nm. It is preferable that indexes of refraction of the first dielectric layer and the third dielectric layer formed as the oblique deposition layers are no less than 1.9 to no more than 2.5.

It is preferable that the first dielectric is tantalum pentoxide or niobium pentoxide. It is preferable that the second dielectric is nonstoichiometric silicon oxide.

It is preferable that a protective layer including fluorine is formed on the dielectric layer which is the top layer. It is preferable that the protection layer has a thickness of no less than 1 nm to no more than 2 nm.

According to the antireflection multilayer film of the present invention, a dust-proof function in addition to an antireflection function can be obtained, since at least two kinds of the dielectric layers varying in the index of refraction are alternately laminated, and the plural dielectric layers composed of the dielectric having the highest index of refraction are the oblique deposition layers formed by oblique vapor deposition. Therefore, it can be prevented deterioration of optical performance due to dust and dirt adhering to the antireflection multilayer film.

BRIEF DESCRIPTION OF THE DRAWINGS

The above and other objects and advantages of the present invention will be more apparent from the following detailed description of the preferred embodiments when read in connection with the accompanied drawings, wherein like reference numerals designate like or corresponding parts throughout the several views, and wherein.

DESCRIPTION OF THE PREFERRED EMBODIMENTS

Figure 1:
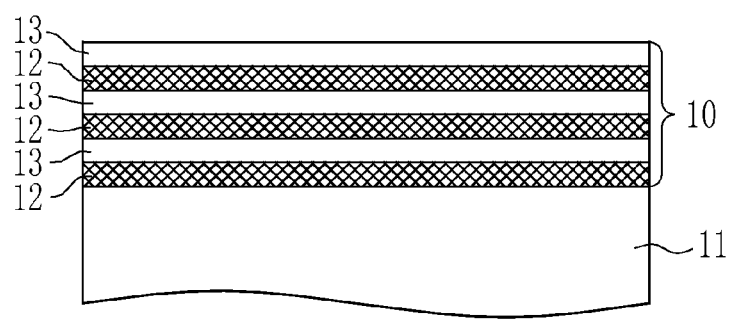
FIG. 1 is a cross-sectional view illustrating an example of an antireflection multilayer film of the present invention.

As illustrated in FIG. 1, an antireflection multilayer film 10 is formed on a surface of an optical element 11, and prevents surface reflection of the optical element 11 to increase incident ray volume to the optical element 11. The optical element 11 performs optical functions such as visible light refraction, and is for example a lens or an optical filter formed by using glass or plastic (resin) for a substrate. Although the substrate of the optical element 11 is exposed in FIG. 1, the optical element 11 may be an element for example made by forming an optical function film such as a polarization separating film or a dichroic film on the surface of the substrate such as of glass. In this case, the antireflection multilayer film 10 is applied on the optical function film. In addition, although the optical element 11 is planar in FIG. 1, it will be a curved shape in case the optical element 11 is a convex lens or a concave lens. In this way, the antireflection multilayer film 10 of the present invention may be formed on optical elements having various surface shapes with various surface treatments applied thereon.

The antireflection multilayer film 10 is a dielectric multilayer film formed by laminating two kinds of dielectric layers (dielectric thin films) having indexes of refraction different from each other. For example, a dielectric layer 12 of a high refractive index (hereinafter referred to as the high refractive index layer) and a dielectric layer 13 of a low refractive index (hereinafter referred to as the low refractive index layer) are alternately laminated in the order of the high refractive index layer 12, the low refractive index layer 13 and the high refractive index layer 12 from the side of the optical element 11. To the air interface, the low refractive index layer 13 is exposed. Although the number of layers of the high refractive index layer 12 and the low refractive index layer 13 to compose the antireflection multilayer film 10 is arbitrary, for example three stacks of the high refractive index layer 12 and the low refractive index layer 13 are laminated so that six layers are formed in total. For example, total thickness of the whole of the antireflection multilayer film 10 is approximately 200-300 nm, because the high refractive index layer 12 and the low refractive index layer 13 are deposited to have a thickness of several ten nanometers.

A material used for the high refractive index layer 12 has a higher refractive index than that of a material forming the low refractive index layer 13. For example it is an inorganic material of high refractive index such as tantalum pentoxide ($Ta_2O_5$), niobium pentoxide ($Nb_2O_5$), titanium oxide ($TiO_2$), chromium oxide ($Cr_2O_3$), zirconium oxide (ZrO), zinc sulphide (ZnS) or so on. Although the material forming the high refractive index layer 12 is arbitrary as long as having a higher refractive index than that of the low refractive index layer 13, it is preferable to have an index of refraction no less than 1.9 to no more than 2.5. From the above-mentioned materials, it is preferable to use tantalum pentoxide or niobium pentoxide. This is because it is easier to give dust resistance property to the antireflection multilayer film 10 than a case with other materials. In this embodiment, tantalum pentoxide is used for the high refractive index layer 12.

In addition, the high refractive index layer 12 is a so-called oblique deposition layer (oblique vapor deposition film) formed by depositing the above-mentioned inorganic material of the high refractive index onto the surface of the optical element 11 from a diagonal direction. Therefore, the high refractive index layer 12 is not isotropic due to internal structures of the layer composed of slant columnar structures grown on the surface of the optical element 11.

The low refractive index layer 13 is a dielectric thin layer, and is formed of a material of a lower refractive index than that of the material forming the high refractive index layer 12. For example, an inorganic material of low refractive index such as aluminum oxide ($Al_2O_3$), a silicon dioxide ($SiO_2$), nonstoichiometric silicon oxide ($SiO_{2-X}$, $0 \leq X < 1$), magnesium fluoride ($MgF_2$) or so on is used. Although the material forming the low refractive index layer 13 is arbitrary as long as having a lower refractive index than that of the high refractive index layer 12, it is preferable to have an index of refraction no less than 1.3 to no more than 1.9. From the above-mentioned materials, it is especially preferable to use nonstoichiometric silicon oxide. This is because it is easier to give dust resistance property to the antireflection multilayer film 10 than a case with other materials. In this embodiment, nonstoichiometric silicon oxide is used for the low refractive index layer 13. Note that the index of refraction of the magnesium fluoride is 1.38 which is the lowest in the low refractive index materials. The silicon oxide has the index of refraction of 1.45.

The low refractive index layer 13 is formed by depositing material particles onto the surface of the optical element 11 from a substantially perpendicular direction. Therefore, the low refractive index layer 13 does not have a minute internal structure like the above-mentioned structure of the high refractive index layer 12, but is an isotropic and dense layer (so-called solid layer).

It was confirmed the dust resistance property of the antireflection multilayer film 10 of the present invention composed as stated above through a following experiment. At first two pieces of glass substrates (SCHOTT D263) for the optical elements 11 were prepared. The antireflection multilayer film 10 of the present invention was formed on the surface of one glass substrate, and a conventional antireflection multilayer film, using isotropic and dense layers for both the high refractive index layer and the low refractive index layer, was formed on the surface of the other glass substrate. Note that the antireflection multilayer film 10 of the present invention which was used in this experiment was composed of six layers formed by alternately laminating the high refractive index layer 12 which was the oblique deposition layer of tantalum pentoxide and the low refractive index layer 13 which was the isotropic dense layer (dense film) of nonstoichiometric silicon oxide. In addition, note that the antireflection multilayer film 10 of the present invention was the same as the conventional antireflection multilayer film about the number of layers, the material of each layer, and the optical film thickness (index of refraction×physical film thickness) of each layer.

Next, abrasives powder (grain size of #1200 (JIS)) for precision polishing was sprayed on the antireflection multilayer film 10 of the present invention formed as described above and the conventional antireflection multilayer film, and then the sprayed abrasives powder was removed by an air duster as much as possible. Thereafter, the central area of 1,280×960 μm of each antireflection multilayer film was photographed, and the number of remained particles of the abrasives powder was counted from the obtained image. Note that this experiment was performed several times.

On the antireflection multilayer film 10 of the present invention, the number of remained particles of the abrasives powder was approximately 10 to 40, and approximately 25 as the average. On the other hand, a large number of particles, which were difficult to count, were detected on the conventional antireflection multilayer film. Almost same experimental results were seen in the conventional antireflection multilayer film, even after manufacturing samples again, indicating the high reproducibility of the experiments.

From this, although the principle is unclear, it is found that the antireflection multilayer film 10 of the present invention, using the oblique deposition layer for the high refractive index layer 12, has the dust resistance property which is not found in the conventional dielectric multilayer film. Accordingly, in case the antireflection multilayer film 10 is formed on the surface of the optical element 11, there is no need to form a dust-resistance coating additionally on the antireflection multilayer film 10. Therefore, both the antireflection effect and the dust resistance property can be provided at low cost by using the antireflection multilayer film 10. In addition, an increase of the thickness of the optical element 11 can be suppressed because the antireflection multilayer film 10 provides both the dust resistance and antireflection properties.

Figure 2:
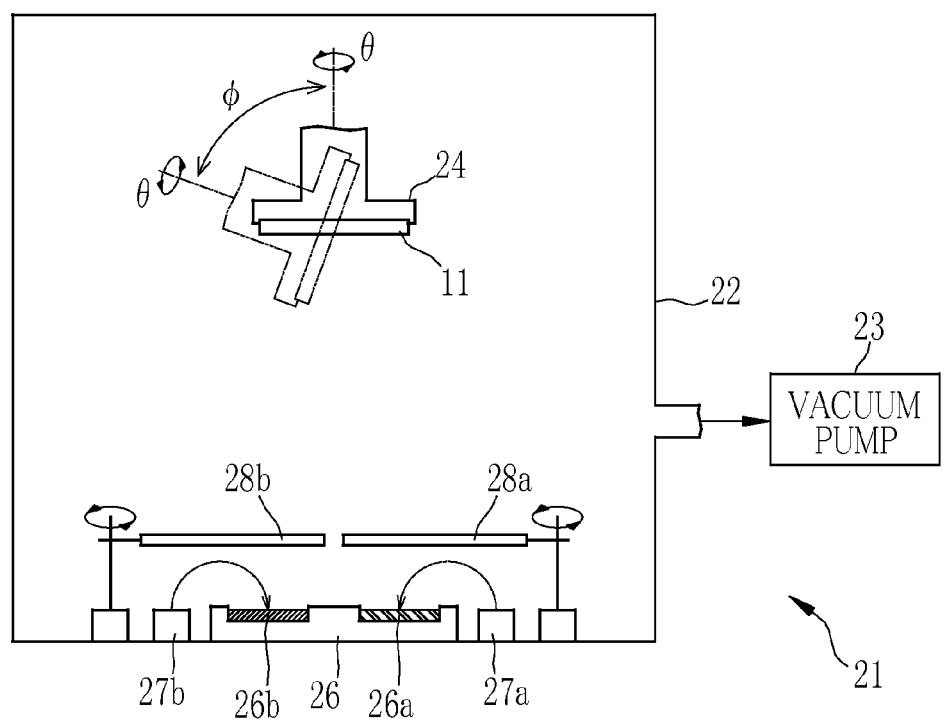
FIG. 2 is a schematic diagram illustrating an evaporation apparatus to form the antireflection multilayer film.

The antireflection multilayer film 10 is formed by for example a deposition apparatus 21 illustrated in FIG. 2. The deposition apparatus 21 comprises a vacuum chamber 22 and a vacuum pump 23. Inside the vacuum chamber 22, there are a substrate holder 24, an evaporation source holder 26, electron guns 27a, 27b, shutters 28a, 28b, a vacuum gage (not illustrated), a thickness meter (not illustrated) and so on.

The substrate holder 24 is a retainer member retaining the optical element 11. The substrate holder 24 can turn the optical element 11 freely in a plane (θ direction) without breaking vacuum of the vacuum chamber 22. In addition, the substrate holder 24 can incline the surface of the optical element 11 freely from evaporation sources 26a and 26b. Although a rolling mechanism and a tilt mechanism of the substrate holder 24 are not illustrated, well-known mechanisms for example using stepping motors and gears can be used.

The evaporation source holder 26 is a so-called crucible, and retains at least the two evaporation sources 26a and 26b. For example, the evaporation source 26a is the high refractive index material for forming the high refractive index layer 12 (tantalum pentoxide or so on), and the evaporation source 26b is the low refractive index material for forming the low refractive index layer 13 (silicon dioxide). The evaporation sources 26a, 26b which are held by the evaporation source holder 26 are heated by electron beam emitted by the electron guns 27a, 27b provided corresponding to each source, to be melted and evaporated toward the optical element 11. In this way, deposition materials of the evaporation sources 26a and 26b are deposited on the surface of the optical element 11. In addition, the shutters 28a, 28b are provided corresponding to each evaporation source 26a, 26b, so that the evaporation of each deposition material can be optionally stopped by opening and closing each shutter 28a, 28b.

In case the antireflection multilayer film 10 is formed by the deposition apparatus 21, at first the optical element 11 is set on the substrate holder 24, and the vacuum pump 23 performs vacuum drawing in the vacuum chamber 22. Then by inclining the substrate holder 24 a predetermined angle (φ°), the surface of the optical element 11 is positioned with a slant to the evaporation source 26a. And then the high refractive index material is evaporated from the evaporation source 26a, and is deposited on the surface of the optical element 11 from the diagonal direction (φ°) with respect to the normal of the surface). The turn of the substrate holder 24 (the optical element 11) stops at this time. By depositing the high refractive index material onto the surface of the optical element 11 from the constant direction, the high refractive index layer 12 of the oblique vapor deposition is formed.

Thereafter, the shutter 28a is closed to stop the deposition of the high refractive material, and the tilt of the substrate holder 24 is returned (−φ°) to the position where the surface of the optical element 11 on which the high refractive index layer 12 is deposited directly faces to the evaporation source 26b. Then the shutter 28b is opened so that the low refractive index material is evaporated from the evaporation source 26b and deposits on the high refractive index layer 12. The substrate holder 24 is turning at a predetermined angular velocity in the in-plane direction during the deposition. In this way, the low refractive index layer 13 which is isotropic and dense is formed of the low refraction index material. When the low refractive index layer 13 reaches predetermined thickness, the shutter 28b is closed to stop the deposition of the low refractive index material.

The above-mentioned formations of the high refractive index layers 12 and the low refractive index layers 13 are alternately repeated while keeping the vacuum state in the vacuum chamber 22, so that the antireflection multilayer film 10 is formed efficiently.

Figure 3:
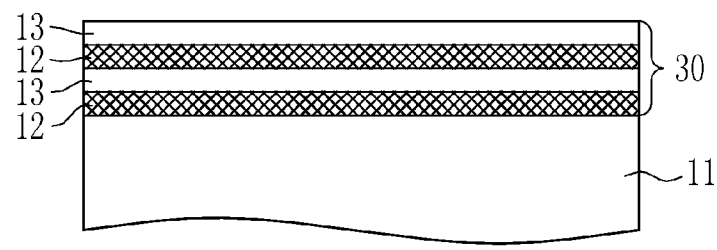
FIG. 3 is a cross-sectional view illustrating an antireflection multilayer film composed of four layers.
Figure 4:
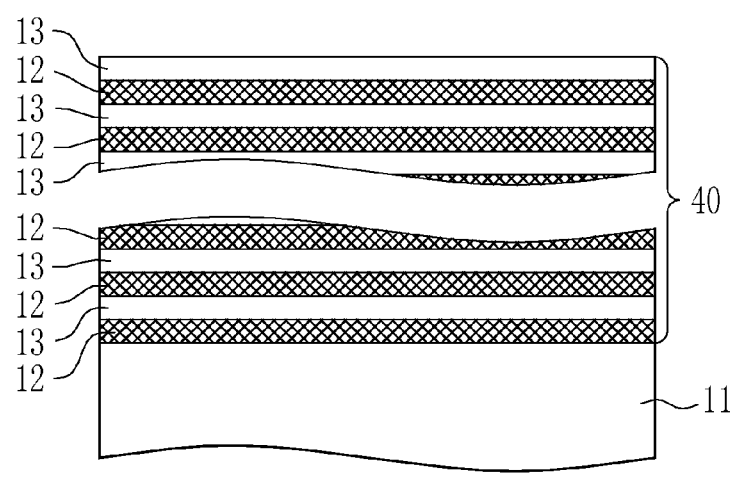
FIG. 4 is a cross-sectional view illustrating an antireflection multilayer film composed of at least eight layers.

Note that in the above embodiment, although the high refractive index layers 12 and the low refractive index layers 13 are alternately laminated so that the six layers are formed in total, the number of stacks of the high refractive index layer and the low refractive index layer 13 contained in the antireflection multilayer film of the present invention is not limited. For example, as an antireflection multilayer film 30 illustrated in FIG. 3, the high refractive index layers 12 and the low refractive index layers 13 may be alternately laminated so that four layers are formed in total. Also to this four layers constitution, the dust resistance property can be applied for example by forming the high refractive index layer 12 by oblique vapor deposition and the low refractive index layer 13 of the dense layer. In addition, as an antireflection multilayer film 40 illustrated in FIG. 4, the high refractive index layers 12 and the low refractive index layers 13 may be alternately laminated so that at least eight layers are formed in total. Also to this constitution, the dust resistance property can be applied for example by forming the high refractive index layer 12 of the oblique deposition layer and the low refractive index layer 13 of the dense layer.

In the above embodiment, all of the high refractive index layers 12 are the oblique deposition layer. However, a part of the high refractive index layers 12 may be the oblique deposition layer. In case a part of the high refractive index layers 12 is the oblique deposition layer, the number of the oblique deposition layers should be at least one, and preferably it is two or more.

Figure 5:
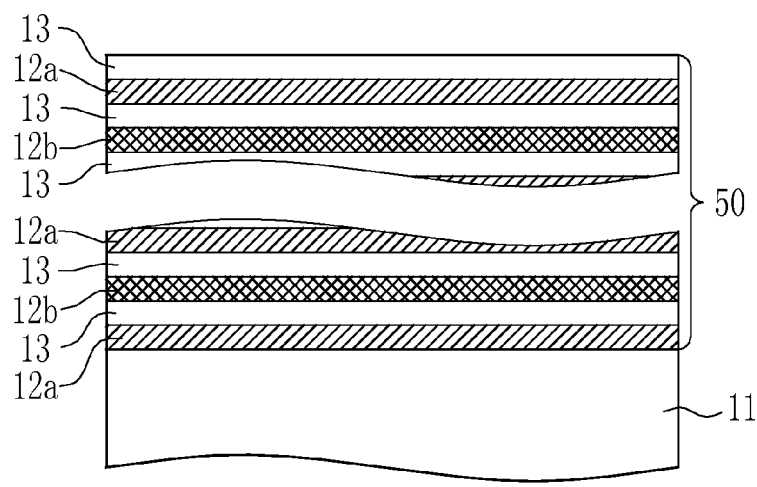
FIG. 5 is a cross-sectional view illustrating a modification of the antireflection multilayer film.

For example, in case the total number of layers of the high refractive index layers and the low refractive index layers is at least eight, like an antireflection multilayer film 50 illustrated in FIG. 5, each number of layers of the high refractive index layers and the low refractive index layers should be at least four. In this case, for example, the dust resistance property may be given to the antireflection multilayer film like the above embodiments by forming all the high refractive index layers as the oblique deposition layers. However, as the antireflection multilayer film 50, the dielectric multilayer film may be formed by alternately laminating the high refractive index layers 12 (12a and 12b) and the low refractive index layers 13, in which only the high refractive index layer 12b is the oblique deposition layer, and the high refractive index layer 12a is the isotropic and dense layer. The high refractive index layer 12a can be formed by the same way as the low refractive index layer 13 but using the high refractive index material.

Accordingly, in case not all of the high refractive index layers 12, but only at least a part of the high refractive index layers 12b is formed of the oblique deposition layer, the dust resistance property is improved from the conventional antireflection multilayer film which does not have the high refractive index layer 12b by the oblique vapor deposition. Since normally it is easier with shorter time to form the isotropic and dense dielectric layer than to form the oblique deposition layer, production efficiency can be improved by mixing the high refractive index layer 12a which is isotropic and dense as described above, in comparison with the case that all of the high refractive index layers 12 are the high refractive index layer 12b by the oblique vapor deposition. Therefore, the antireflection multilayer film 50 having dust resistance property can be achieved at a low cost.

However, the dust resistance property of the antireflection multilayer film 50 is almost proportional to a number of layers of the high refractive index layers 12b by the oblique vapor deposition. Accordingly, in view of the dust resistance property, the number of layers of the high refractive index layers 12b by the oblique vapor deposition is preferably as many as possible. Therefore, comparing with a case that only one oblique deposition layer is provided, it is preferable that all the high refractive index layers 12b are the oblique deposition layer as illustrated in FIG. 5, or also the high refractive index layers 12a are the oblique deposition layer. In addition, as described later, to reduce retardation occurred by using the oblique deposition layer as the high refractive index layer 12, it is preferable to provide at least two layers of the high refractive index layers 12b by the oblique vapor deposition.

Note that in the above embodiments, a direction (that is an optical axis) of each of the high refractive index layers 12 by oblique vapor deposition is not described. However, there is a direction (that is an optical axis) of the oblique deposition layer depending on the tilt direction of the columnar structure forming the internal structure. Therefore, the oblique deposition layer 12 functions as a so-called O plate and generates retardation when light perpendicularly transmits the layer 12. In case the high refractive index layer 12 is thin, or a small number of the high refractive index layers 12 are included in the antireflection multilayer film, the generated retardation may be ignored. However, in case the high refractive index layer 12 by oblique vapor deposition is thick, or there is a large number of the high refractive index layers 12, especially in case all the high refractive index layers 12 are formed as the oblique deposition layer to get high dust resistance like the above embodiments, the retardation generated in the antireflection multilayer film may be a degree that cannot be ignored.

The antireflection multilayer film intends to get antireflection effect, and it is unfavorable to generate unnecessary retardation. In case the antireflection multilayer film generates the unnecessary retardation, optical properties of the optical element 11 may be deteriorated. Especially in case the optical element 11 uses birefringence effect, providing the antireflection multilayer film may prevent obtaining desired optical properties. Described below is how to reduce the unnecessary retardation in case at least one of the layers is formed as the oblique deposition layer to obtain the dust resistance property, like the antireflection multilayer films 10, 30, 40 and 50 of the above embodiments.

Figure 6:
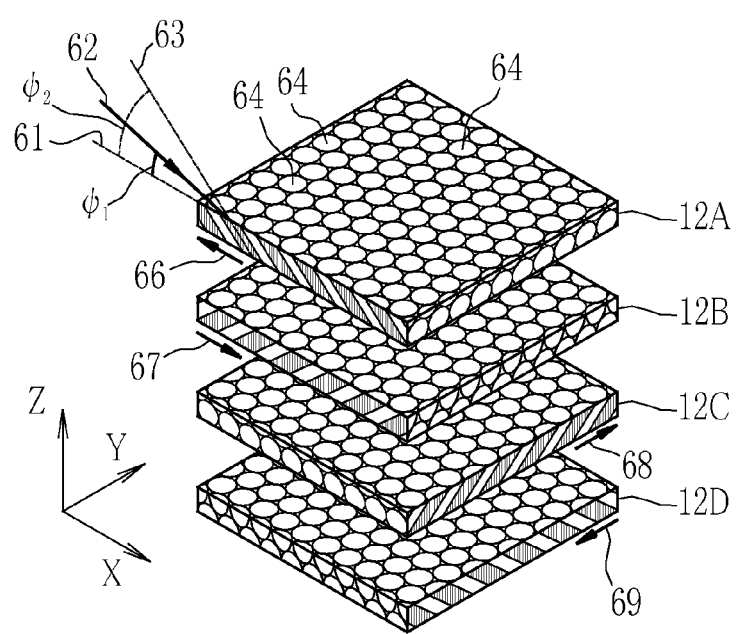
FIG. 6 is an explanatory view illustrating the deposition direction of each oblique deposition layer.

As illustrated in FIG. 6, the high refractive index layer 12A of the oblique vapor deposition is formed by the oblique vapor deposition from −X direction (deposition direction) 62 with an angle $\phi_1$ to a direction 61 of the surface (XY plane) of the optical element 11. Usually, an inclination angle $\phi_2$ of the columnar structure 64 of the high refractive index layer 12A becomes larger than the deposition angle $\phi_1$, and an inclination direction 63 of the columnar structure 64 becomes a direction of an arrow 66 that is a projection of the deposition direction 62 on the surface of the optical element 11. Since the high refractive index layer 12A is approximately isotropic in the Y direction but is anisotropic in the X direction as described above, it has birefringence characteristics that the X direction and the Y direction become a slow axis (optical axis) and a fast axis (optical axis) respectively, and generates retardation when light perpendicularly transmits the optical element 11 (light transmitting in the Z direction).

The retardation caused by birefringence characteristics of the high refractive index layer 12A can be almost canceled for example by the high refractive index layer 12B. In the high refractive index layer 12B, the inclination angle of the columnar structure 64 is the same with that of the high refractive index layer 12A (the inclination angle $\phi_2$), and the inclination direction is +X direction (the direction of an arrow 67) that is reversed from that of the high refractive index layer 12A. The high refractive index layer 12B can be formed by lamination in conditions for example that an inclination ($\phi$) of the substrate holder 24 is equal to and the substrate holder 24 is turned 180 degrees in the plane direction from the conditions for laminating the high refractive index layer 12A.

Although the columnar structures 64 of the high refractive index layer 12A and the high refractive index layer 12B slant toward ±X directions respectively, the retardation may be compensated by making inclination directions of the columnar structures 64 to ±Y directions illustrated with an arrow 68 and an arrow 69, like a high refractive index layer 12C and a high refractive index layer 12D. In other words, by using one set of high refractive index layers in which inclination directions of the columnar structures 64 are opposite to each other, occurrence of the unnecessary retardation can be prevented. The directions of these columnar structures 64 in the XY plane are arbitrary.

Furthermore, a high refractive index layer of another oblique vapor deposition film may be provided for example between the high refractive index layer 12A and the high refractive index layer 12B, and between the high refractive index layer 12C and the high refractive index layer 12D. For example, even in case the placement order of the high refractive index layer 12B and the high refractive index layer 12C is changed, the high refractive index layer 12A and the high refractive index layer 12B and the high refractive index layer 12C and the high refractive index layer 12D can compensate each other's retardation.

As it is revealed from the above description, the antireflection multilayer film of the present invention preferably uses one set of high refractive index layers in which the deposition angles are equal to but the deposition directions are opposite to each other. In other words, in focusing on an arbitrary high refractive index layer, it is preferable that a high refractive index layer whose deposition angle is equal to but the deposition direction is opposite to the focused high refractive index layer is included. In this way, retardation to be caused by the antireflection multilayer film of the present invention can be reduced.

In the antireflection multilayer film of the present invention, it is preferable that the birefringence measured from the vertical direction (the retardation occurred from the light penetrating the antireflection multilayer film perpendicularly) is no more than 1 nm. In case the birefringence is no more than 1 nm, the birefringence generated in the antireflection multilayer film will become a degree which can be almost ignored in terms of the functions of the optical element 11.

Note that for example in case the antireflection multilayer film 10 is formed to have six layers in total (see FIG. 1) including three high refractive index layers 12 which are the oblique deposition layers, by making one pair of two layers whose deposition directions are opposite to each other, retardation can be reduced more than a case that all of three layers have the same deposition direction.

Figure 7:
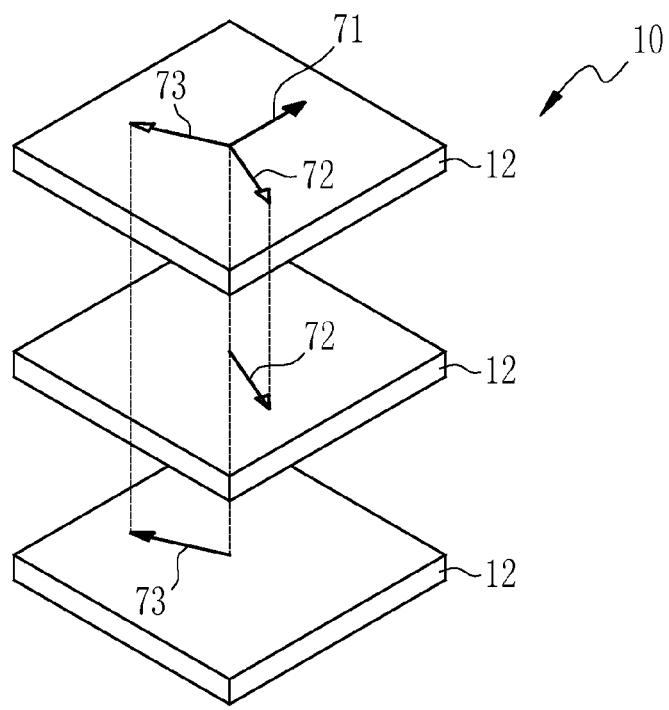
FIG. 7 is an explanatory view illustrating the deposition directions of the three high refractive index layers which are the oblique deposition layers of FIG. 1.

In addition, as illustrated in FIG. 7, by making deposition directions (inclination directions of the columnar structures 64) 71, 72, 73 of the high refractive index layers 12 so that each direction has an angle of 120 degrees to each other in the plane direction, the three layers as one group can compensate each other's retardation. Similarly, in case n layers of the high refractive index layers 12 of the oblique vapor deposition are provided, by making each layer to have an angle of 360/n degrees to each other, the n layers as one group can compensate each other's retardation.

Note that in case the antireflection multilayer films 10 are provided on the front and back of the optical element 11 respectively, it is preferable that each of the antireflection multilayer films 10 has oblique deposition layers whose deposition directions are opposite to each other, so that each retardation can be reduced. In addition, by making deposition directions of the oblique deposition layer in the antireflection multilayer film 10 on the front side and the oblique deposition layer in the antireflection multilayer film 10 on the back side to be opposite to each other, the antireflection multilayer films 10 on the front and back sides may cancel each other's retardation. In this case, the number of oblique deposition layers included in the antireflection multilayer film 10 on the front side and the number of oblique deposition layers included in the antireflection multilayer film 10 on the back side are the same.

Figure 8:
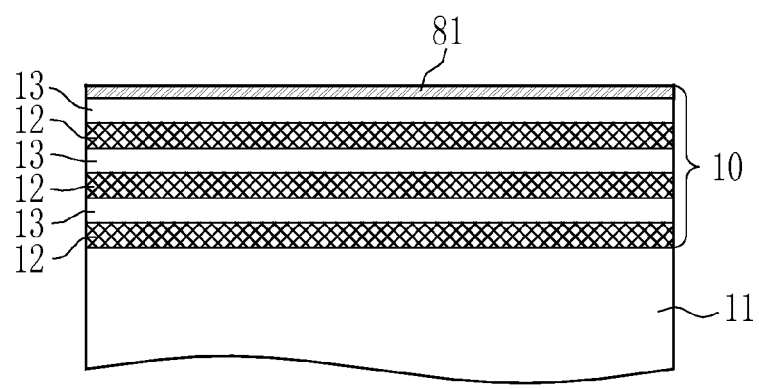
FIG. 8 is a cross-sectional view of the antireflection multilayer film on which an oil-resistant coating is provided.

In the above embodiment, the low refractive index layer 13 is exposed on the surface of the antireflection multilayer film 10. However, for example as illustrated in FIG. 8, in the antireflection multilayer film 10, it is preferable that a transparent protective layer 81 is provided on the top layer of the layered body of the high refractive index layers 12 and the low refractive index layers 13. For example, the protective layer 81 is an oil-repellent or water-repellent coating formed of a material including fluorine. Specifically, $MgF_2$ is suitable for the protective layer 81, and a resin material may be used as long as the material has oil-repellent or water-repellent property. In case the protective layer 81 is provided in this way, since oil-repellent or water-repellent property can be added to the antireflection multilayer film 10 having dust resistance property, it becomes easy to remove dust and dirt by air dusters even when dust and dirt adheres to the antireflection multilayer film 10. In addition, even in case that oils and fats adhere to the surface by erroneously touching the surface in maintenance or so on, they can be removed easily. It is preferable to include the protective layer 81 for the antireflection multilayer films 30, 40 and 50 of various modification likewise.

However, dust resistance property of the antireflection multilayer film 10 becomes hard to be obtained in case the protective layer 81 is too thick. Therefore, to obtain both the dust resistance property and oil-repellent (water-repellent) property of the antireflection multilayer film 10, the thickness of the protective layer 81 is preferably no less than 1 nm to no more than 5 nm, more preferably no less than 1 nm to no more than 2 nm.

Note that in the above embodiments, the high refractive index layers 12 and the low refractive index layers 13 are alternately laminated in order of the high refractive index layer 12, the low refractive index layer 13, and the high refractive index layer 12 from the side of the optical element 11, so that the high refractive index layer 12 is placed on the surface of the optical element 11 and the low refractive index layer 13 is exposed to air. However, the low refractive index layer 13 may be placed on the surface of the optical element 11 and the high refractive index layer 12 may be exposed to air.

In the above embodiments, the number of the low refractive index layers 13 is the same as that of the high refractive index layers 12, so that the total number of layers in the antireflection multilayer film 10 becomes the even number. However, the number of the high refractive index layer 12 may be one more than that of the low refractive index layer 13, or the low refractive index layer 13 may be one more than that of the high refractive index layer 12. For example, the low refractive index layer 13 may be added to the bottom layer of the antireflection multilayer film 10, or the high refractive index layer 12 may be added to the top layer of the antireflection multilayer film 10.

Furthermore, in case three layers varying in an index of refraction are laminated to form the antireflection multilayer film, it is preferable to use a deposition material having an index of refraction no less than 1.9 to no more than 2.5 for the layer having the highest refractive index, especially preferable to use tantalum pentoxide or niobium pentoxide. In addition, it is preferable to use nonstoichiometric silicon oxide for the layer having the lowest refractive index. High dust resistance property can be easily obtained by using these materials.

In addition, the type of the optical element 11 for incorporating the antireflection multilayer film of the present invention is arbitrary. For example, the optical element 11 includes not only lenses or various optical filters, but also touch panels or liquid crystal panels. The antireflection multilayer film of the present invention is especially optimum for elements which are exposed outside so that a user is likely to touch, such as touch panels and liquid crystal panels. In addition, in case the antireflection multilayer film of the present invention is provided on the element which a user is likely to touch, it is preferable to form the protective layer 81 illustrated in FIG. 8.

Although the present invention has been fully described by the way of the preferred embodiment thereof with reference to the accompanying drawings, various changes and modifications will be apparent to those having skill in this field. Therefore, unless otherwise these changes and modifications depart from the scope of the present invention, they should be construed as included therein.

What is claimed is:

1. An antireflection multilayer film comprising:
a first dielectric layer composed of a first dielectric having high refractive index and functioning as an O plate;
a second dielectric layer which is laminated on the first dielectric layer as an isotropic layer and is composed of a second dielectric having lower refractive index than that of the first dielectric; and
a third dielectric layer which is laminated on the second dielectric layer, is composed of the first dielectric and functions as an O-plate,
wherein indexes of refraction of the first dielectric layer and the third dielectric layer are no less than 1.9 to no more than 2.5, and
wherein inclination directions of columnar structures of the first and the third dielectric layers have an angle of 180 degrees to each other in a plane direction.

2. The antireflection multilayer film according to claim 1, wherein the first dielectric layer and the third dielectric layer formed as the oblique deposition layers have optical axes which are different from each other in the oblique deposition layers to cancel birefringence occurring in each oblique deposition layer.

3. The antireflection multilayer film according to claim 1, wherein birefringence measured in the vertical direction is no more than 1 nm.

4. The antireflection multilayer film according to claim 1, wherein the first dielectric is tantalum pentoxide or niobium pentoxide.

5. The antireflection multilayer film according to claim 1, wherein the second dielectric is nonstoichiometric silicon oxide.

6. The antireflection multilayer film according to claim 1, wherein a protective layer including fluorine is formed on the dielectric layer which is the top layer.

7. The antireflection multilayer film according to claim 6, wherein the protection layer has a thickness of no less than 1 nm to no more than 2 nm.

8. The antireflection multilayer film according to claim 1, wherein an index of refraction of the second dielectric layer as the isotropic layer is no less than 1.3 to no more than 1.9.

9. An antireflection multilayer film comprising:
first to nth O plates having refraction indexes from 1.9 to 2.5 where n is an integer greater than 1; and
first to nth low refractive index layers having refraction indexes from 1.3 to 1.9 and lower than that of the O plates,
wherein the O plates and the low refractive index layers are alternately laminated, and
wherein inclination directions of columnar structures of the O plates have an angle of 360/n degrees to each other in a plane direction.

10. The antireflection multilayer film according to claim 9, wherein n is 3 and the inclination directions have an angle of 120 degrees to each other in the plane direction.

11. An optical multilayer film comprising:
an optical element;
a first antireflection multilayer film disposed on a front side surface of the optical element; and
a second antireflection multilayer film disposed on a back side surface of the optical element, each of the first and second antireflection multilayer films including;
first to nth O plates having refraction indexes from 1.9 to 2.5 where n is an integer greater than 1; and
first to nth low refractive index layers having refraction indexes from 1.3 to 1.9 and lower than that of the O plates,
wherein inclination directions of columnar structures of the O plates in the first antireflection multilayer film and inclination directions of columnar structures of the O plates in the second antireflection multilayer film are opposite to each other.

* * * * *